(12) United States Patent
Danjo et al.

(10) Patent No.: US 7,902,464 B2
(45) Date of Patent: Mar. 8, 2011

(54) HEAT SINK ARRANGEMENT FOR ELECTRICAL APPARATUS

(75) Inventors: Kenzo Danjo, Osaka (JP); Hideo Ishii, Osaka (JP); Masao Katooka, Osaka (JP); Shuji Yokoyama, Osaka (JP)

(73) Assignee: Sansha Electric Manufacturing Company, Limited, Osaka-shi, Osaka-fu (JP)

( * ) Notice: Subject to any disclaimer, the term of this patent is extended or adjusted under 35 U.S.C. 154(b) by 58 days.

(21) Appl. No.: 12/475,728

(22) Filed: Jun. 1, 2009

(65) Prior Publication Data

US 2009/0237898 A1 Sep. 24, 2009

Related U.S. Application Data

(62) Division of application No. 11/439,412, filed on May 22, 2006, now Pat. No. 7,579,554.

(30) Foreign Application Priority Data

May 25, 2005 (JP) .................. 2005-152393

(51) Int. Cl.
*H05K 1/16* (2006.01)
(52) U.S. Cl. ...................... 174/260; 174/252

(58) Field of Classification Search .................. 174/252, 174/261, 260
See application file for complete search history.

(56) References Cited

U.S. PATENT DOCUMENTS

| 4,931,134 | A | 6/1990 | Hatkevitz et al. |
| 5,031,023 | A * | 7/1991 | Murari et al. ................. 257/707 |
| 5,988,738 | A | 11/1999 | Blessing et al. |
| 6,185,101 | B1 | 2/2001 | Itabashi et al. |
| 6,418,021 | B1 | 7/2002 | Itabashi et al. |
| 6,501,662 | B2 | 12/2002 | Ikeda |
| 6,646,884 | B1 | 11/2003 | Frisch et al. |
| 7,012,812 | B2 | 3/2006 | Haba |
| 7,151,671 | B2 * | 12/2006 | Hyodo ......................... 361/717 |

FOREIGN PATENT DOCUMENTS

| JP | 004231140 A1 | 3/1994 |
| JP | 07-007167 U | 1/1995 |

* cited by examiner

*Primary Examiner* — Ishwarbhai B Patel
(74) *Attorney, Agent, or Firm* — Duane Morris LLP

(57) ABSTRACT

A printed circuit board (120) includes an insulating substrate (120a) on which conductive films (120b) are formed. Semiconductor devices (8) disposed external to the printed circuit board (120) have their leads (24a, 24b, 24c) connected to the conductive films. A flexible portion (30) is formed in the insulating substrate (120a) at a location near the location where the leads (24a, 24b, 24c) are connected to the conductive films (120b).

1 Claim, 2 Drawing Sheets

HEAT SINK ARRANGEMENT FOR ELECTRICAL APPARATUS

CROSS-REFERENCE TO RELATED APPLICATION

The present application is a divisional application of U.S. patent application Ser. No. 11/439,412 filed May 22, 2006, now U.S. Pat. No. 7,579,554, the entirety of which is hereby incorporated by reference herein.

FIELD OF THE INVENTION

This invention relates to dissipation of heat from an electrical apparatus, e.g. a power supply apparatus, employing semiconductor devices.

BACKGROUND OF THE INVENTION

Some electrical apparatus, e.g. a power supply apparatus, uses power semiconductor devices as its components. Power semiconductor devices are connected to a driver printed circuit board on which a driver circuit for driving the power semiconductor devices is formed. The driver printed circuit board is connected to a control printed circuit board on which a control circuit for controlling the driver circuit is formed. The power semiconductor devices are mechanically coupled to a heat sink for dissipating heat from the semiconductor devices. In order to downsize the power supply apparatus, the control printed circuit board may be mounted to the heat sink on which the power semiconductor devices are mounted, with the driver printed circuit board mounted between the power semiconductor devices and the control printed circuit board, to thereby assemble them into a single block. If, however, rigid boards are used for the control and driver printed circuit boards, dimensional errors and/or assemblage errors of such printed circuit boards may place strain on the power semiconductor devices, causing the semiconductor devices to float up from the heat sink, which impedes normal heat dissipation and may break down the power semiconductor devices. In addition, the printed circuit boards themselves may be also strained. When such power supply apparatus is transported or removed to another place, vibrations caused by the moving may be applied to the power supply apparatus. Then, the vibrations are superposed on the strain on the power semiconductor devices and the printed circuit boards, which may lead to breakdown of the printed circuit boards and the power semiconductor devices.

JP 7-7167 U discloses use of a flexible board for connecting components mounted on a case to components mounted on a printed circuit board attached to the case.

Similar flexible boards would be used to connect the above-described power semiconductor devices to the driver printed circuit board and to connect the driver printed circuit board to the control printed circuit board. This arrangement, however, would require two flexible boards in addition to the driver and control printed circuit boards. In addition, a space for disposing the flexible boards must be secured, which impedes downsizing of the power supply apparatus.

An object of the present invention is to provide an electrical apparatus, in which electrical components are prevented from being broken down and, still, which can be small in size.

SUMMARY OF THE INVENTION

An electrical apparatus according to an embodiment of the present invention includes a first printed circuit board formed of an insulating substrate which is coated with an electrically conductive film. The first printed circuit board may be a multi-layered board or a single-layered board. An electrical component disposed external to the first printed circuit board has a rigid connector connected to the conductive film of the first printed circuit board. This connection of the connector to the conductive film may put strain to the connector, the electrical component and/or the first printed circuit board. The insulating substrate includes a flexible portion in the vicinity of the portion of the conductive film to which the electrical component is connected.

The flexible portion may be formed by thinning a portion, which is to become the flexible portion, of the insulating substrate relative to the remaining portion.

The electrical component may be a semiconductor device mounted on a heat sink. In such case, the connector is a lead of the semiconductor device. The semiconductor device may be a power semiconductor device.

The first printed circuit board may be disposed near the heat sink. In addition, a second printed circuit board may be mounted to the surface of the heat sink opposite to the surface on which the semiconductor device is mounted. The second printed circuit board is electrically and mechanically coupled to the first printed circuit board.

DESCRIPTION OF PREFERRED EMBODIMENT OF THE INVENTION

Figure 1:
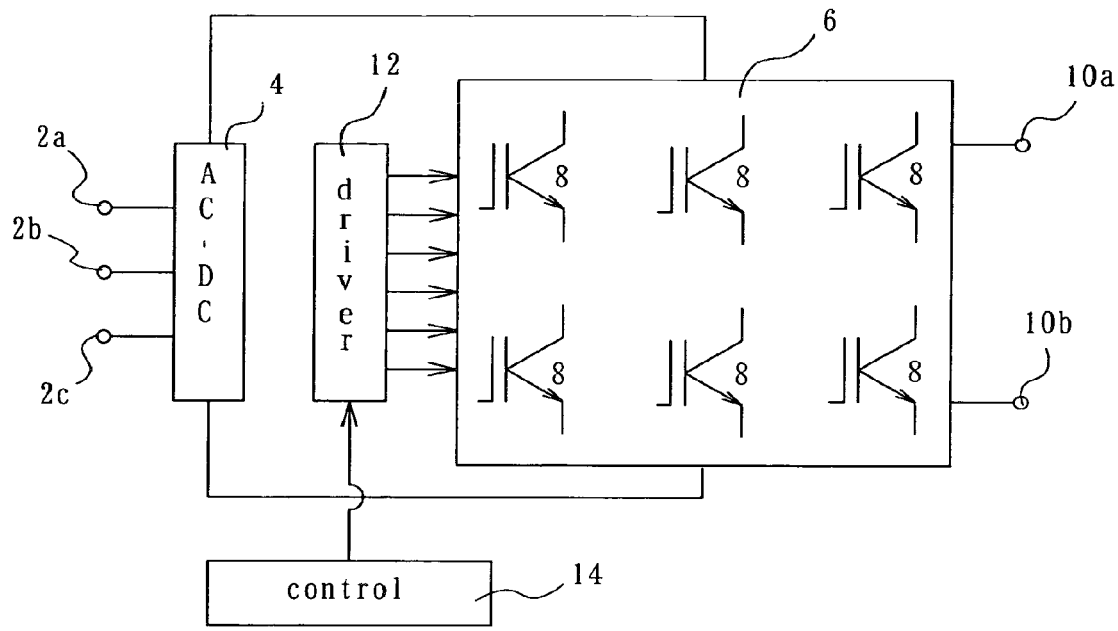
FIG. 1 is a block diagram of an electrical apparatus according to an embodiment of the present invention.

An electrical apparatus according to an embodiment of the present invention is, for example, a power supply apparatus for use in welding or electroplating. The power supply apparatus includes, as shown in FIG. 1, an AC-to-DC converting circuit 4 for converting a three-phase commercial AC voltage, for example, applied to power supply input terminals 2a, 2b and 2c, to a DC voltage. The AC-to-DC converting circuit 4 includes, for example, a rectifying circuit and a smoothing circuit. The DC voltage from the AC-to-DC converting circuit 4 is applied to a DC-to-AC converting circuit, e.g. an inverter 6, which includes plural, e.g. six, power semiconductor devices, e.g. IGBTs 8. The IGBTs 8 are connected in a full-bridge circuit configuration. The DC voltage applied to the inverter 6 is converted therein to a high-frequency voltage, which is developed between two inverter output terminals 10a and 10b. The high-frequency voltage is voltage-transformed by a transformer (not shown), and the voltage-transformed high-frequency voltage is converted to a DC voltage by a high-frequency-to-DC converting circuit (not shown). The resulting DC voltage is applied across a load, for example, between a torch and workpiece in a welding machine, or between two electrodes for electroplating.

Control signals for controlling the respective IGBTs 8 to convert the DC voltage applied thereto to the high-frequency voltage are supplied to the respective IGBTs 8 from a driver circuit 12. A control circuit 14 gives instructions to the driver circuit 12 regarding the manner in which the IGBTs 8 should be controlled.

Figure 2:
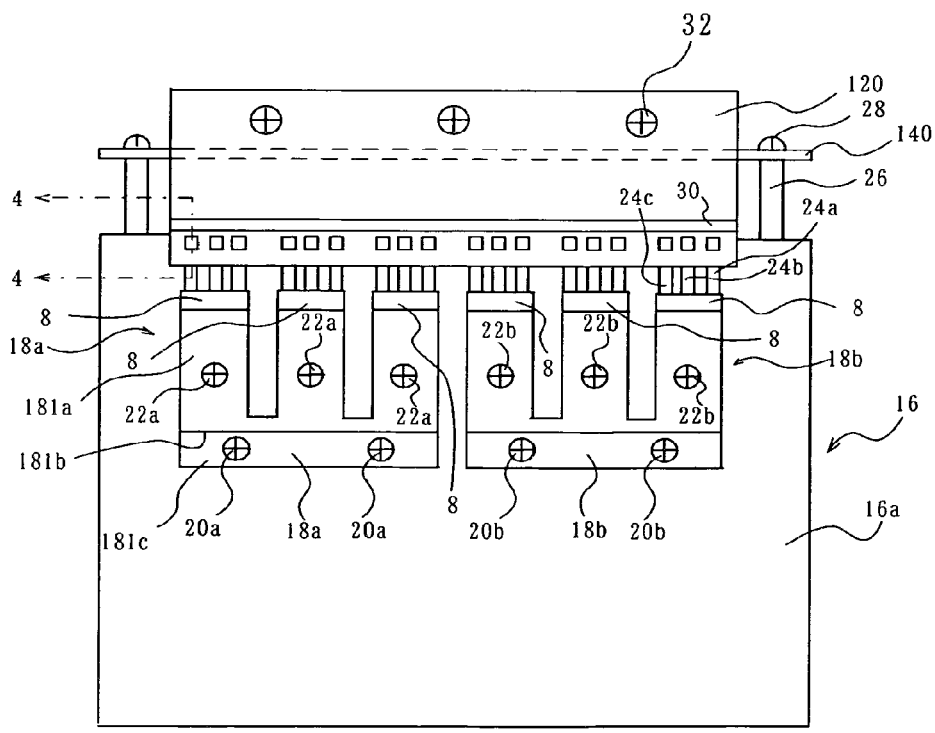
FIG. 2 is a front view of a heat dissipating portion of the electrical apparatus shown in FIG. 1.
Figure 3:
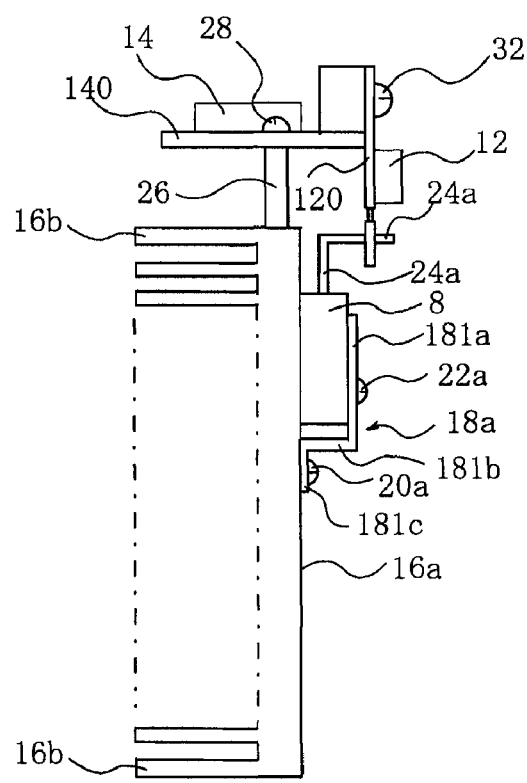
FIG. 3 is a side view of the heat dissipating portion shown in FIG. 2.

As shown in FIGS. 2 and 3, each of the IGBTs 8 is arranged in a chip form and mounted on a heat sink 16. Each IGBT 8 is the electrical component as referred to in the accompanying Claims.

The heat sink 16 has an IGBT mounting surface 16a of a rectangular shape, for example, as shown in FIG. 3, and also a number of fins 16b on the opposite surface. The fins 16b extend substantially perpendicularly to the mounting surface 16a. Three IGBTs 8 are disposed in a row on the mounting surface 16a, and their heat dissipating surfaces are in surface-contact with the mounting surface 16a. The three IGBTs 8 are pressed against the mounting surface 16a by means of a retainer 18a.

The retainer 18a has three planar portions 181a contacting a larger portion of the surfaces of the three IGBTs 8 opposite to the heat dissipating surfaces thereof. The three planar portions 181a are connected together by a connecting portion 181b, which is bent, at a portion near a first side surface of the IGBTs 8, toward the mounting surface 16a of the heat sink 16. A lip portion 181c integral with the connecting portion 181b is in contact with the mounting surface 16a. The lip portions 181c is fixed to the mounting surface 16a by means of two screws 20a. The respective IGBTs 8 are screwed to the mounting surface 16a by three screws 22a extending, through the respective planar portions 181a of the retainer 18 and the IGBTs 8, into the mounting surface 16a. The remaining three IGBTs 8 are similarly mounted on the mounting surface 16a of the heat sink 16 by means of a retainer 18b and screws 20b and 22b, which are similar to the retainer 18a and the screws 20a and 22a.

Each IGBT 8 has three leads 24a, 24b and 24c. The three leads 24a-24c of each IGBT 8 extend from a second side surface thereof, which is opposite to the first side surface, in the direction away from the retainers 18a and 18b, and are bent in a direction away from the heat sink 16. The leads 24a-24c are made of a material having high rigidity, e.g. metal. The leads 24a-24c are the connector referred to in the accompanying Claims. The leads 24a-24c are electrically and mechanically connected by, for example, soldering, to patterned conductors formed at predetermined locations on a printed circuit board 120, on which the driver circuit 12 is arranged. This eliminates the need for use of wires for electrical connections between the respective IGBTs 8 and the printed circuit board 120. The printed circuit board 120 is disposed, being spaced from and substantially in parallel with the mounting surface 16a of the heat sink 16. The printed circuit board 120 slightly overlaps the mounting surface 16a, and the remaining portion lies outside the mounting surface 16a. The printed circuit board 120 is the first printed circuit board referred to in the accompanying Claims.

The printed circuit board 120 has its portion remote from the mounting surface 16a secured to a printed circuit board 140, on which the control circuit 14 is arranged, by means of three screws 32. The driver circuit on the printed circuit board 120 is electrically connected to the control circuit 14 on the printed circuit board 140. The printed circuit board 140 is disposed, being spaced from and in parallel with the outermost fin 16b, and is secured to the outermost fin 16b by means of a plurality of spacers 26 and screws 28. Thus, the major surfaces of the printed circuit board 140 lie perpendicular to the IGBTs 8. In this manner, the heat sink 16 with the IGBTs 8 mounted thereon and the printed circuit boards 120 and 140 form one block. The printed circuit board 140 is the second printed circuit board referred to in the accompanying Claims.

Generally, the printed circuit boards 120 and 140 are formed of a rigid or hard insulating materials, e.g. a glass epoxy material, with a electrically conductive film, e.g. copper foil. Electric components are soldered to the conductive films at predetermined locations. If, therefore, the dimensional precision of the printed circuit boards 120 and 140 is low, and/or the precision of assemblage of the IGBTs 8 and printed circuits boards 120 and 140 is low, strain may be put on the IGBTs 8, which causes the IGBTs 8 to rise up from the mounting surface 16a, resulting in insufficient heat dissipation from the IGBTs 8. In some cases, strain is put on the leads 24a-24c of the IGBTs 8, causing the rigid leads 24a-24c to snap or bend.

Figure 4:
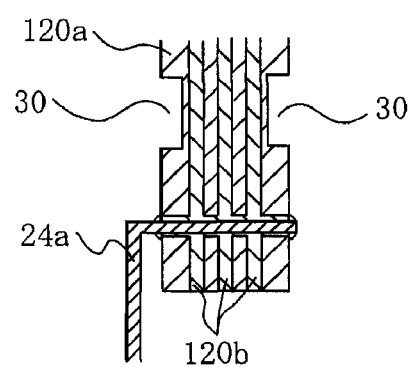
FIG. 4 is a cross-sectional view along a line 4-4 in FIG. 2.

In order to solve this problem, according to this embodiment, a flexible portion 30 is formed in the printed circuit board 120. As shown in FIG. 4, the printed circuit board 120 is a multi-layered printed circuit board formed of an epoxy glass material 120a within which a conductive pattern formed of plural, e.g. three, conductive films 120b, is arranged. The flexible portion 30 is formed by removing part of the epoxy glass material 120a from the opposite major surfaces of the epoxy glass material 120a, at a location slightly spaced in the direction away from the leads 24a-24c. The flexible portion 30 extends in the direction along which the leads 24a-24c are arranged.

The flexible portion 30 can absorb strain which may be generated, as described above, when the dimensional precision of the printed circuit boards 120 and 140 and/or the precision of assembling the IGBTs 8 and the printed circuit boards 120 and 140 are low. Then, it never happens that the contact of the IGBTs 8 with the heat sink 16 becomes defective, or that the leads 24a-24c snap or bend. Since the flexible portion 30 is formed by removing part of the insulating material of the printed circuit board 120, there is no need for preparing a separate, flexible printed circuit board for connection of the IGBTs 8 and the printed circuit board 120, in order for strain to be absorbed.

The present invention has been described as being embodied in a power supply apparatus for welders or electroplating machines. However, the present invention is not limited to them, but it can be embodied in any electrical apparatuses in which electrical components need be connected to printed circuit boards. Further, the flexible portion has been described as being formed in a multi-layered printed circuit board, but, when the printed circuit board used includes a conductive film only on one surface, the flexible portion can be formed by removing part of the insulating material from the other surface of the printed circuit board. In the described embodiment, the leads of the semiconductor devices are soldered to the printed circuit board 120, but they may be electrically and mechanically connected by screwing, caulking or the like. Furthermore, other semiconductor devices, such as bipolar transistors and FETs, than IGBTs may be used.

What is claimed is:

1. An electrical apparatus comprising:
   a multi-layered printed circuit board formed of a glass epoxy material, said multi-layered printed circuit board having opposing two major surfaces and comprising one electrically conductive pattern formed within said glass epoxy material, said conductive pattern being formed by a plurality electrically conductive films;
   a plurality of semiconductor devices disposed in a line external to said multi-layered printed circuit board, said semiconductor devices respectively having rigid leads extending through said multi-layered printed circuit board between said opposing two major surfaces, whereby said semiconductor devices are connected to respective ones of said plurality of electrical conductive films, said semiconductor devices being mounted on a heat sink disposed near said multi-layered printed circuit board; and a second printed circuit board mounted on a surface of said heat sink different from the surface on which said semiconductor devices are mounted, said second printed circuit board being disposed perpendicular to one of said major surfaces of said multi-layered printed circuit board; and said second printed circuit board being mechanically connected to said multi-layered printed circuit board;

a flexible portion being formed in said multi-layered printed circuit board at a location between a location where said rigid lead of each of said semiconductor devices is connected to an associated one of said conductive films and a location where said second printed circuit board is connected, said flexible portions being formed by removing said epoxy glass material from both of said opposing major surfaces, said flexible portions being formed in a line extending along said line in which said semiconductor devices are disposed;

a driver circuit for said semiconductor devices being disposed on said multi-layered printed circuit board; and a control circuit for giving instructions to said driver circuit being disposed on said second printed circuit board.

\* \* \* \* \*